US010600613B2

(12) United States Patent
Zeidler et al.

(10) Patent No.: US 10,600,613 B2
(45) Date of Patent: Mar. 24, 2020

(54) PARTICLE BEAM SYSTEM (71) Applicant: Carl Zeiss Microscopy GmbH, Jena (DE)

(72) Inventors: Dirk Zeidler, Oberkochen (DE); Thomas Kemen, Meppen (DE); Christof Riedesel, Aalen (DE); Ralf Lenke, Lauchheim (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 16/196,081

(22) Filed: Nov. 20, 2018

(65) Prior Publication Data
US 2019/0088440 A1    Mar. 21, 2019

Related U.S. Application Data (63) Continuation of application No. 15/411,538, filed on Jan. 20, 2017, now Pat. No. 10,147,582, which is a (Continued)

(30) Foreign Application Priority Data

May 30, 2014  (DE) .................. 10 2014 008 083

(51) Int. Cl.
*H01J 37/10* (2006.01)
*H01J 37/09* (2006.01)
(Continued)

(52) U.S. Cl.
CPC ............. *H01J 37/10* (2013.01); *H01J 37/09* (2013.01); *H01J 37/12* (2013.01); *H01J 37/24* (2013.01);
(Continued)

(58) Field of Classification Search
CPC .. H01J 37/10; H01J 37/09; H01J 37/12; H01J 37/24; H01J 37/26; H01J 3/28; H01J 2237/0453; H01J 2237/1202
(Continued)

(56) References Cited

U.S. PATENT DOCUMENTS 5,892,224 A    4/1999 Nakasuji
9,536,702 B2    1/2017 Lang et al.
(Continued)

FOREIGN PATENT DOCUMENTS

CN        101103417 A        1/2008
DE     10 2013 014 976       3/2015
(Continued)

OTHER PUBLICATIONS

German Office Action, with translation thereof, for corresponding DE Appl No. 10 2014 008 083.8, dated Mar. 17, 2015.
(Continued)

*Primary Examiner* — Nicole M Ippolito
*Assistant Examiner* — Hanway Chang
(74) *Attorney, Agent, or Firm* — Fish & Richardson P.C.

(57) ABSTRACT

Particle beam system comprising a particle source; a first multi-aperture plate with a multiplicity of openings downstream of which particle beams are formed; a second multi-aperture plate with a multiplicity of openings which are penetrated by the particle beams; an aperture plate with an opening which is penetrated by all the particles which also penetrate the openings in the first and the second multi-aperture plate; a third multi-aperture plate with a multiplicity of openings which are penetrated by the particle beams, and with a multiplicity of field generators which respectively provide a dipole field or quadrupole field for a beam; and a controller for feeding electric potentials to the multi-aperture plates and the aperture plate so that the second openings in
(Continued)

the second multi-aperture plate respectively act as a lens on the particle beams 3 and feed adjustable excitations to the field generators.

10 Claims, 8 Drawing Sheets

Related U.S. Application Data continuation of application No. 14/724,432, filed on May 28, 2015, now Pat. No. 9,552,957.

(51) Int. Cl.
| | |
|---|---|
| *H01J 37/12* | (2006.01) |
| *H01J 37/28* | (2006.01) |
| *H01J 37/26* | (2006.01) |
| *H01J 37/24* | (2006.01) |

(52) U.S. Cl.
CPC ............. *H01J 37/26* (2013.01); *H01J 37/28* (2013.01); *H01J 2237/0453* (2013.01); *H01J 2237/1202* (2013.01)

(58) Field of Classification Search
USPC ......... 250/396 R, 397, 398, 399, 400, 492.1, 250/492.2, 492.22
See application file for complete search history.

(56) References Cited

U.S. PATENT DOCUMENTS

| | | |
|---|---|---|
| 9,552,957 B2 | 1/2017 | Zeidler et al. |
| 9,799,485 B2 | 10/2017 | Mueller et al. |
| 9,922,799 B2 | 3/2018 | Li et al. |
| 9,991,089 B2 | 6/2018 | Mueller et al. |
| 10,147,582 B2 | 12/2018 | Zeidler et al. |
| 2004/0188636 A1 | 9/2004 | Hosoda et al. |
| 2006/0289804 A1 | 12/2006 | Knippelmeyer et al. |
| 2007/0228274 A1 | 10/2007 | Elyasaf et al. |
| 2008/0210887 A1 | 9/2008 | Buschbeck |
| 2009/0114818 A1 | 5/2009 | Casares et al. |
| 2009/0159810 A1 | 6/2009 | Knippelmeyer et al. |
| 2009/0256075 A1 | 10/2009 | Kemen et al. |
| 2009/0261267 A1 | 10/2009 | Wieland et al. |
| 2010/0065753 A1 | 3/2010 | Enyama et al. |
| 2010/0178602 A1 | 7/2010 | Seto et al. |
| 2010/0320382 A1 | 12/2010 | Almogy et al. |
| 2012/0104250 A1 | 5/2012 | Bean et al. |
| 2012/0241606 A1 | 9/2012 | Han |
| 2012/0273690 A1 | 11/2012 | Wieland et al. |
| 2012/0305798 A1 | 12/2012 | Zonnevylle et al. |
| 2013/0032729 A1 | 2/2013 | Knippelmeyer |
| 2013/0187046 A1 | 7/2013 | Zeidler et al. |
| 2014/0070099 A1 | 3/2014 | Aliman et al. |
| 2014/0197322 A1 | 7/2014 | Eder et al. |
| 2014/0224985 A1 | 8/2014 | Rodgers et al. |
| 2015/0069235 A1 | 3/2015 | Kemen et al. |
| 2015/0083911 A1 | 3/2015 | Zeidler et al. |
| 2015/0090879 A1 | 4/2015 | Zeidler et al. |
| 2015/0348738 A1 | 12/2015 | Zeidler et al. |
| 2015/0348749 A1 | 12/2015 | Lang et al. |
| 2015/0357157 A1 | 12/2015 | Mueller et al. |
| 2017/0133194 A1 | 5/2017 | Zeider et al. |
| 2018/0040454 A1 | 2/2018 | Mueller et al. |

FOREIGN PATENT DOCUMENTS

| | | |
|---|---|---|
| DE | 10 2013 016 113 | 3/2015 |
| DE | 10 2014 008 083 A1 | 12/2015 |
| DE | 10 2014 008 105 A1 | 12/2015 |
| DE | 10 2014 008 383 A1 | 12/2015 |
| EP | 1 995 350 B1 | 7/2018 |
| TW | 200739645 A | 10/2007 |
| WO | WO 2005/024881 | 3/2005 |
| WO | WO 2007/028595 | 3/2007 |
| WO | WO 2007/028596 | 3/2007 |
| WO | WO 2007/060017 | 5/2007 |
| WO | WO 2008/101714 A2 | 8/2008 |
| WO | WO 2011/124352 A1 | 10/2011 |
| WO | WO 2012/041464 A1 | 4/2012 |
| WO | WO 2012/112894 A2 | 8/2012 |
| WO | WO 2012/151288 A1 | 11/2012 |
| WO | WO 2013/032949 A1 | 3/2013 |
| WO | WO 2015/043769 A1 | 4/2015 |

OTHER PUBLICATIONS

S.E. Kapl et al., „Characterization of CMOS programmable multi-beam blanking arrays as used for programmable multi-beam projection lithography and resistless nanopattering, Journal of Micromechanics and Microengineering, vol. 21, 2011, pp. 1-8.

Zeiss, "Sigma Series: Your FE-SEM for Nanoscale Analytics", 2012, pp. 1-18 (http://www.optecgroup.com/upload/iblock/480/Sigma_FE_SEM.pdf).

Taiwanese Office Action, with translation thereof, for corresponding TW Appl No. 104117140, dated Oct. 17, 2018.

PARTICLE BEAM SYSTEM

CROSS-REFERENCE TO RELATED APPLICATIONS

The present application is a continuation of, and claims benefit under 35 USC 120 to, U.S. application Ser. No. 15/411,538, filed Jan. 20, 2017, now U.S. Pat. No. 10,147,582, which claims benefit under 35 USC 120 to, U.S. application Ser. No. 14/724,432, filed May 28, 2015, now U.S. Pat. No. 9,552,957, which claims benefit under 35 USC 119 to German Application No. 10 2014 008 083.8, filed May 30, 2014. The entire disclosure of U.S. application Ser. Nos. 15/411,538, 14/724,432 and German Application No. 10 2014 008 083.8 are incorporated by reference herein.

The invention relates to particle beam systems which operate with a multiplicity of particle beams.

WO 2005/024881 A2 discloses an electron microscope system which operates with a multiplicity of electron beams for the parallel scanning of an object to be inspected with a bundle of electron beams. The bundle of electron beams is generated by directing onto a multi-aperture plate, which has a multiplicity of openings, an electron beam generated by an electron source. One portion of the electrons of the electron beam is incident onto the multi-aperture plate and is absorbed there, and another portion of the beam penetrates the openings of the multi-aperture plate so that there is formed in the beam path downstream of each opening an electron beam whose cross section is defined by the cross section of the opening. Furthermore, suitably selected electric fields which are provided in the beam path upstream and/or downstream of the multi-aperture plate cause each opening in the multi-aperture plate to act as a lens on the electron beam penetrating the opening so that the electron beam is focused in a plane which lies at a distance from the multi-aperture plate. The plane in which the foci of the electron beams are formed is imaged by downstream optics onto the surface of the object to be inspected so that the individual electron beams are incident onto the object as focused primary beams. There, they generate backscattered electrons emanating from the object, or secondary electrons which are formed into secondary beams and are directed by further optics onto a detector.

There, each of the secondary beams is incident onto a separate detector element so that the electron intensities detected therewith provide information relating to the object at the location where the corresponding primary beam is incident onto the object. The bundle of primary beams is scanned systematically over the surface of the object in order to generate an electron microscopic image of the object in the usual way for scanning electron microscopes.

The resolution of a scanning electron microscope is limited by the diameter of the primary beam incident onto the object. Consequently, in multi-beam electron microscopy all the beams should form the same small focus on the object.

The present invention correspondingly has an object of proposing a particle beam system which operates with a multiplicity of particle beams and can be used to achieve a higher resolution.

In accordance with embodiments of the invention, a particle beam system is proposed which comprises a particle source which is configured to generate a beam of charged particles. The particle beam system can have a first multi-aperture plate which has a multiplicity of first openings and which is arranged in a beam path of the particles in such a way that particles of the beam are partially incident onto the first multi-aperture plate and partially penetrate the first openings of the first multi-aperture plate so that there is formed in the beam path downstream of each first opening a particle beam whose cross section is defined by a cross section of the first opening. The particle system can have a second multi-aperture plate which has a multiplicity of second openings and which is arranged in the beam path of the particles so that particles of the particle beams penetrate one of the first openings in the first multi-aperture plate and one of the second openings in the second multi-aperture plate. Furthermore, the particle beam system can have an aperture plate which is arranged at a distance from the second multi-aperture plate and has a single opening which is penetrated by all the particles which also penetrate the first and second openings in the first and the second multi-aperture plate. Furthermore, the particle beam system can have a third multi-aperture plate which has a multiplicity of third openings and which is arranged in the beam path of the particles so that particles of the particle beams which penetrate one of the first openings in the first multi-aperture plate and one of the second openings in the second multi-aperture plate also penetrate one of the third openings in the third multi-aperture plate. The third multi-aperture plate can support a multiplicity of field generators, one of the field generators being assigned to each one of the third openings, each of the field generators being configured to provide a dipole field or quadrupole field which acts on the particles penetrating the respective third opening. Furthermore, the particle beam system has a controller which is configured to feed a first electric potential to the aperture plate and a second electric potential to the second multi-aperture plate, the first and the second electric potential being selected so that the second openings in the second multi-aperture plate respectively act as a lens on the particles, respectively penetrating the second openings, of the particle beams, and to feed adjustable excitations to the field generators assigned to the third openings of the third multi-aperture plate.

In accordance with exemplary embodiments, the adjustable excitations can be adjusted so that intensities of the dipole fields or quadrupole fields and orientations of the dipole fields or quadrupole fields are respectively adjustable in a circumferential direction around the third opening.

In accordance with further exemplary embodiments, the diameter of the second openings of the second multi-aperture plate can be at least 1.05 times, in particular 1.8 times, greater than the diameter of the corresponding first openings of the first multi-aperture plate. In further embodiments, the diameters of the third openings of the third multi-aperture plate can be at least 1.05 times greater than the diameters of the corresponding first openings of the first multi-aperture plate.

The electric potential fed to the aperture plate should differ from the electric potential fed to the multi-aperture plate so that there is generated between the two plates an electric field which extends up to the second multi-aperture plate. The electric field causes the openings in the second multi-aperture plate to act respectively as a lens on the particle beams penetrating the opening. The lens action is selected so that the particle beams form a real focus in the beam path downstream of the second multi-aperture plate, or form a virtual focus in the beam path upstream of the second multi-aperture plate. The foci can be imaged into a plane or onto an object by downstream optics.

The upstream and/or downstream optics are typically not imaging error-free, and so those foci of the particle beams which result in the downstream plane or on the object do not have a desired small diameter. It is therefore possible to provide the third multi-aperture plate, the openings of which are likewise penetrated by the particle beams. In this case, the field generators which are assigned to the openings can manipulate separately each individual beam. Since the field generators can provide a quadrupole field with adjustable intensity and orientation, it is possible to compensate an astigmatism exerted by the downstream optics on individual particle beams so that the particle beam can form a small round focus in the plane of the object.

The openings in the first multi-aperture plate should have smaller diameters than the corresponding openings in the second multi-aperture plate which provide the lens actions on the particle beams. The diameter of the openings in the first multi-aperture plate defines the diameter of the particle beams in the beam path downstream of the first multi-aperture plate. If the first multi-aperture plate is arranged in the beam path upstream of the second multi-aperture plate, the openings of the second multi-aperture plate have a greater diameter than the particle beams which penetrate the openings. Consequently, the diameter of the lenses provided by the openings in the second multi-aperture plate is greater than the particle beams penetrating the lenses, and so lens defects, in particular a spherical aberration, of the lenses do not impair the focusing of the particle beams so strongly as would be the case were the diameter of the particle beams equal to the diameter of the openings providing the lens action.

When the first multi-aperture plate is arranged in the beam path downstream of the second multi-aperture plate, the abovenamed advantage comes to bear nevertheless, although the entire diameter of the openings providing the lens action is penetrated by particles. This is the case because there the particles penetrating the openings in the second aperture plate outside a cross section which corresponds to the cross section of the downstream openings in the first multi-aperture plate, specifically the increased spherical aberrations experience the lens action, but are incident onto the downstream first multi-aperture plate and cannot penetrate its openings, and so make no contribution to the downstream particle beams and also cannot impair the focusing thereof.

In accordance with exemplary embodiments, the third multi-aperture plate is arranged in the beam path upstream of the second multi-aperture plate. In accordance with exemplary embodiments, in this case the first multi-aperture plate is arranged in the beam path upstream of the third multi-aperture plate. This has the advantage that no particles of the particle beams defined by the first multi-aperture plate are incident onto the third multi-aperture plate and the field generators provided there. Since electric excitations have to be fed to the field generators, insulating regions are provided there between lead wires, the regions being capable of becoming charged owing to incident particles, and of causing interfering stray fields.

In accordance with further exemplary embodiments, the second multi-aperture plate is arranged in the beam path upstream of the first multi-aperture plate. As explained above, the particles which form the particle beams defined by the openings in the first multi-aperture plate nevertheless penetrate the openings in the second multi-aperture plate in their central regions so that spherical aberrations of the lenses provided by the openings in the second multi-aperture plate do not greatly impair the focusing of the particle beams. In accordance with embodiments herein, however, the third multi-aperture plate is nevertheless arranged in the beam path of the particles downstream of the first multi-aperture plate such that particles as small as possible are incident onto the third multi-aperture plate.

In accordance with exemplary embodiments, the multi-aperture plates are arranged at a slight distance from one another. An example of such a slight distance is a distance which is 0.1 times to 10.0 times, in particular 0.3 times to 3.0 times, the diameter of the openings of the first multi-aperture plate. Such small distances have the advantage that particles which are scattered at edges of the openings of the first multi-aperture plate are not incident onto the downstream aperture plate with the larger openings, and therefore could not generate there any charges whose electric fields would cause interference.

In accordance with exemplary embodiments, the field generators assigned to an opening in the third multi-aperture plate have eight electrodes which are arranged distributed in a circumferential direction around the opening. The electrodes can be fed voltages which can be adjusted by the controller, in order to generate electric quadrupole fields of desired intensities and orientations.

In accordance with alternative embodiments, the field generators can comprise at least four coils which are arranged distributed in a circumferential direction around the opening, and the coils can be supplied with adjustable currents by the controller in order to generate magnetic quadrupole fields of adjustable intensities and orientations.

In accordance with exemplary embodiments, an electronic circuit is mounted on the third multi-aperture plate, or on a carrier on which the third multi-aperture plate is mounted. The controller can be configured to generate the data representing the excitations of the field generators and transmit them to the electronic circuit via a serial data link. Each one of the field generators can be connected to the electronic circuit via at least eight feeders. On the basis of the received data, the electronic circuit generates the excitations of each field generator and applies appropriate voltages to—or feeds appropriate current into—the at least eight feeders via which the field generator is connected to the electronic circuit. For this purpose, the electronic circuit has, inter alia, D/A converters and microcontrollers in order to use digital signals input via the digital data line to generate the required current and/or voltages as analogue signals.

Since the number of the particle beams is to be large, and the number of the feeders is a multiple of the particle beams, and each field generator is to be individually capable of excitation, the number of the feeders required to excite the field generators is very large.

The field generators assigned to the openings in the third multi-aperture plate should be arranged together with the multi-aperture plates in the vacuum space of the particle beam system. If the electronic circuit which generates the excitations of the field generators and feeds their feeders were to be arranged outside the vacuum, a vacuum lead-through would be required for all the lines, and this would be very expensive. In accordance with the embodiment described here, however, only one vacuum leadthrough is required for the serial data line, and this is associated with a reduced outlay.

Embodiments of the invention are explained below in more detail with the aid of figures, in which.

Figure 1:
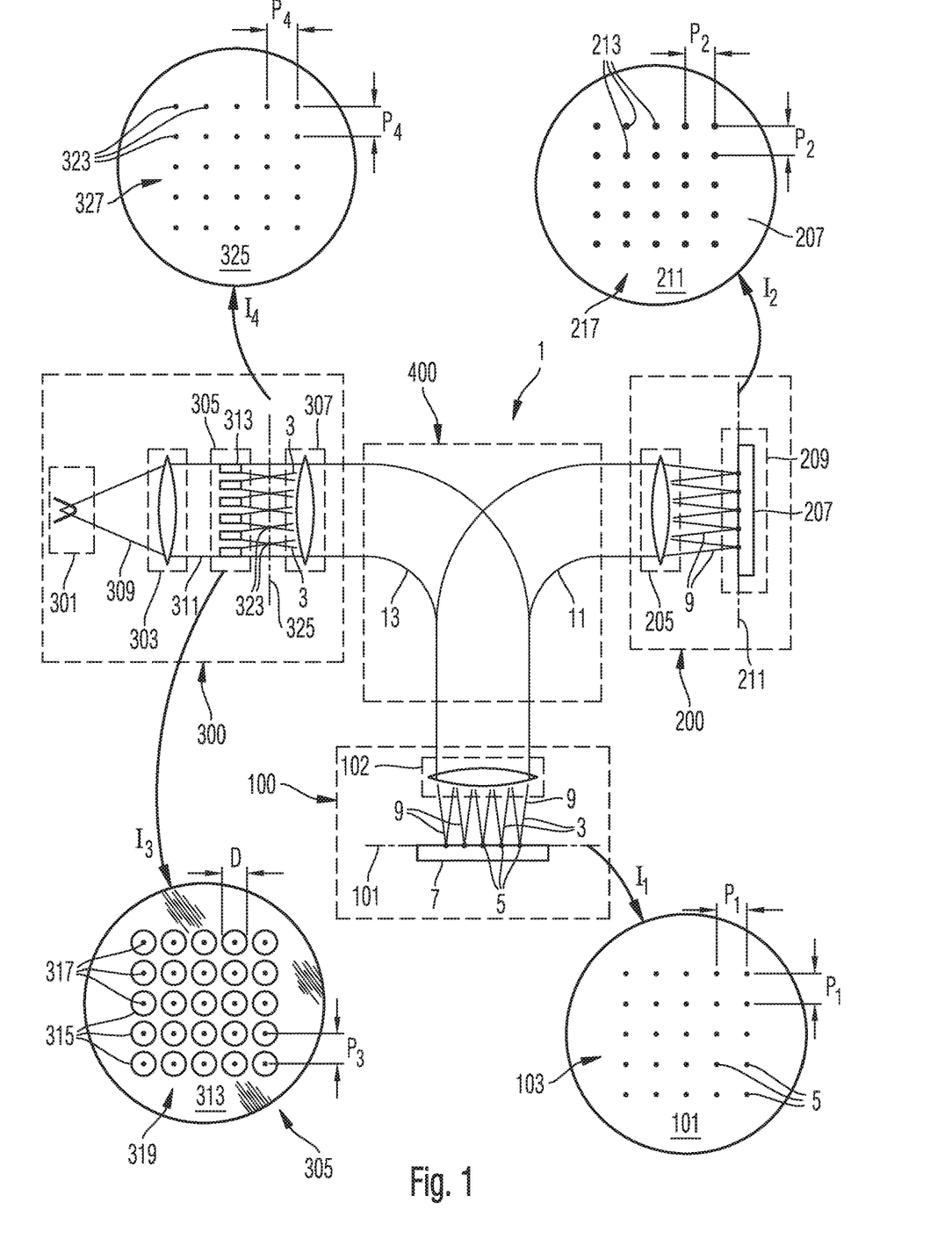
FIG. 1 shows a diagrammatic representation of a multi-beam particle microscope.

FIG. 1 is a diagrammatic representation of a particle beam system 1 which employs a multiplicity of particle beams. The particle beam system 1 generates a multiplicity of particle beams which are incident onto an object to be inspected in order to bring about there electrons which emanate from the object and are subsequently detected. The particle beam system 1 is of the scanning electron microscope type (SEM) which employs a plurality of primary electron beams 3 which are incident at locations 5 on a surface of the object 7 and generate there a plurality of electron beam spots. The object 7 to be inspected can be of any desired sort and, for example, comprise a semiconductor wafer, a biological sample and an arrangement of miniaturized elements or the like. The surface of the object 7 is arranged in an object plane 101 of an objective lens 102 of an objective lens system 100.

The enlarged section I1 of FIG. 1 shows a top view of the object plane 101 with a regular rectangular field 103 of locations of incidence 5 which are formed in the plane 101. The number of the locations of incidence in FIG. 1 is 25, and they form a 5×5 field 103. The number 25 of locations of incidence is a small number selected for reasons of simplified representation. In practice, the number of beams and/or locations of incidence can be selected to be much larger—20×30, 100×100 and the like, by way of example.

In the embodiment represented, the field 103 of locations of incidence 5 is a substantially regular rectangular field with a constant distance $P_1$ between neighbouring locations of incidence. Exemplary values of the distance $P_1$ are 1 micrometre, 10 micrometres and 40 micrometres. However, it is also possible for the field 103 to have other symmetries such as, for example, a hexagonal symmetry.

A diameter of the beam spots formed in the object plane 101 can be small. Examples of values of the diameter are 1 nanometre, 5 nanometres, 100 nanometres and 200 nanometres. The focusing of the particle beams 3 for the formation of the beam spots 5 is performed by the objective lens system 100.

The particles incident onto the object generate electrons which emanate from the surface of the object 7. The electrons emanating from the surface of the object 7 are formed into electron beams 9 by the objective lens 102. The inspection system 1 provides an electron beam path 11 for feeding the multiplicity of electron beams 9 to a detection system 200. The detection system 200 comprises electron optics with a projection lens 205 for directing the electron beams 9 onto an electron multidetector 209.

Section I2 in FIG. 1 shows a top view of a plane 211 in which are lying individual detection regions onto which the electron beams 9 are incident at locations 213. The locations of incidence 213 lie in a field 217 at a regular distance $P_2$ from one another. Exemplary values of the distance $P_2$ are 10 micrometres, 100 micrometres and 200 micrometres.

The primary electron beams 3 are generated in a beam generating device 300 which comprises at least one electron source 301, at least one collimation lens 303, a multi-aperture arrangement 305 and a field lens 307. The electron source 301 generates a diverging electron beam 309 which is collimated by the collimation lens 303 in order to form a beam 311 which illuminates the multi-aperture arrangement 305.

The section I3 in FIG. 1 shows a top view of the multi-aperture arrangement 305. The multi-aperture arrangement 305 comprises a multi-aperture plate 313 which has a plurality of openings or apertures 315 formed therein. The centres 317 of the openings 315 are arranged in a field 319 which corresponds to the field 103 which is formed by the beam spots 5 in the object plane 101. A distance $P_3$ of the centres 317 of the apertures 315 from one another can have, for example, values of 5 micrometres, 100 micrometres and 200 micrometres. The diameters D of the apertures 315 are smaller than the distance $P_3$ of the centres of the apertures. Exemplary values of the diameters D are $0.2 \times P_3$, $0.4 \times P_3$ and $0.8 \times P_3$.

Electrons of the illuminating beam 311 penetrate the apertures 315 and form electron beams 3. Electrons of the illuminating beam 311, which are incident onto the plate 313, are captured by the latter and do not contribute to formation of the electron beams 3.

Owing to an imposed electrostatic field, the multi-aperture arrangement 305 focuses the electron beams 3 in such a way that beam foci 323 are formed in a plane 325. A diameter of the foci 323 can be 10 nanometres, 100 nanometres and 1 micrometre, for example.

The field lens 307 and the objective lens 102 provide a first imaging particle optics for the purpose of imaging the plane 325, in which the foci are formed, onto the object plane 101 so as to form there a field 103 of locations of incidence 5 or beam spots on the surface of the object 7.

The objective lens 102 and the projection lens arrangement 205 provide a second imaging particle optics for the purpose of imaging the object plane 101 onto the detection plane 211. The objective lens 102 is therefore a lens which is part both of the first and of the second particle optics, while the field lens 307 belongs only to the first particle optics, and the projection lens 205 belongs only to the second particle optics.

A beam switch 400 is arranged in the beam path of the first particle optics between the multi-aperture arrangement 305 and the objective lens system 100. The beam switch 400 is also part of the second particle optics in the beam path between the objective lens system 100 and the detection system 200.

Further information relating to such multibeam inspection systems and components employed therein such as, for example, particle sources, multi-aperture plates and lenses, can be obtained from the International Patent Applications WO 2005/024881, WO 2007/028595, WO 2007/028596 and WO 2007/060017 and the German patent applications with the application numbers DE 10 2013 016 113.4 and DE 10 2013 014 976.2, the content of disclosure of which is incorporated in full in the present application by reference.

Figure 2:
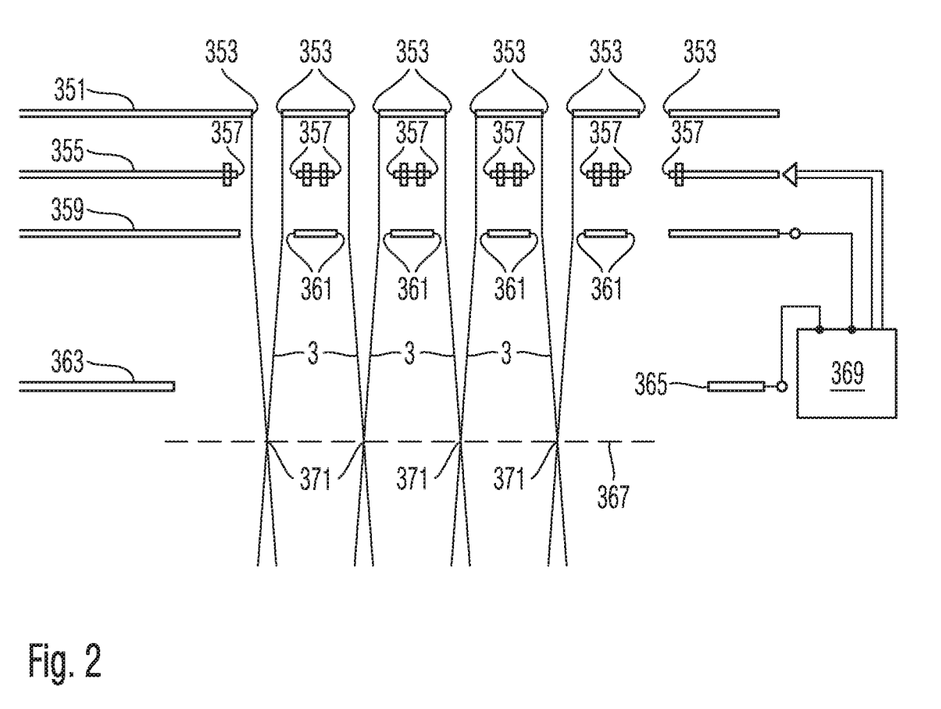
FIG. 2 shows a diagrammatic sectional view of an arrangement with three multi-aperture plates in cross section.

FIG. 2 is a diagrammatic sectional view of an arrangement 305 for generating and focusing a multiplicity of particle beams such as can be employed in the system of FIG. 1. The arrangement comprises a first multi-aperture plate 351 with a multiplicity of openings 353, a second multi-aperture plate 359 with a multiplicity of openings 361, a third multi-aperture plate 355 with a multiplicity of openings 357 and an aperture plate 363 with a single opening 365. Using a single beam of charged particles which, in the illustration of FIG. 2, are incident from above onto the first multi-aperture plate 315, the arrangement forms a multiplicity of individual particle beams 3 and focuses them in a plane 367. In the embodiment explained here, the charged particles are electrons. In other embodiments, it is also possible to employ ions as charged particles.

Figure 3:
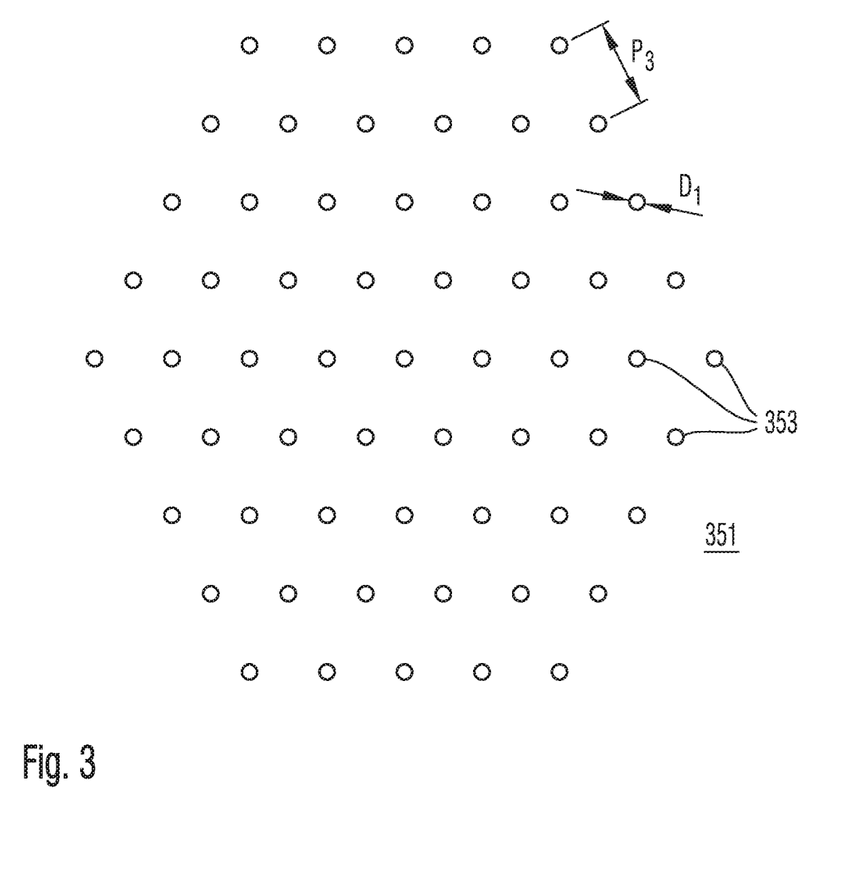
FIG. 3 shows a top view of a first multi-aperture plate of the arrangement in accordance with FIG. 2.

FIG. 3 shows a top view of the first multi-aperture plate 351. The openings 353 have a circular cross section and a diameter $D_1$ from 10 to 100 micrometres, for example 35 micrometres. The number of the openings 353 is $3 \cdot n \cdot (n-1)+1$, n being a natural number. In the example illustrated here, n=5, and the number of openings 353 is 61, the latter being arranged in a hexagonal pattern. A rectangular field with a hexagonal pattern, or a rectangular field with a rectangular pattern would also be possible. A distance $P_3$ between the centres of mutually adjacent openings 353 can be 15 to 300 micrometres, for example 100 micrometres. A portion of the particles incident from above onto the multi-aperture plate 351 in the illustration of FIG. 2 penetrates the plate through the openings 353 and subsequently forms the multiplicity of particle beams 3. The remainder of the particles is absorbed by the multi-aperture plate 351 or otherwise held back. The cross section of the openings 353 therefore defines the cross section of the particle beams 3 formed downstream of the multi-aperture plate 351. In the illustrated example with circular openings 353, the beam bundles formed in the beam path downstream of the multi-aperture plate 351 therefore likewise have a circular cross section with a diameter of, for example, 30 µm, 45 µm and 55 µm.

Figure 4:
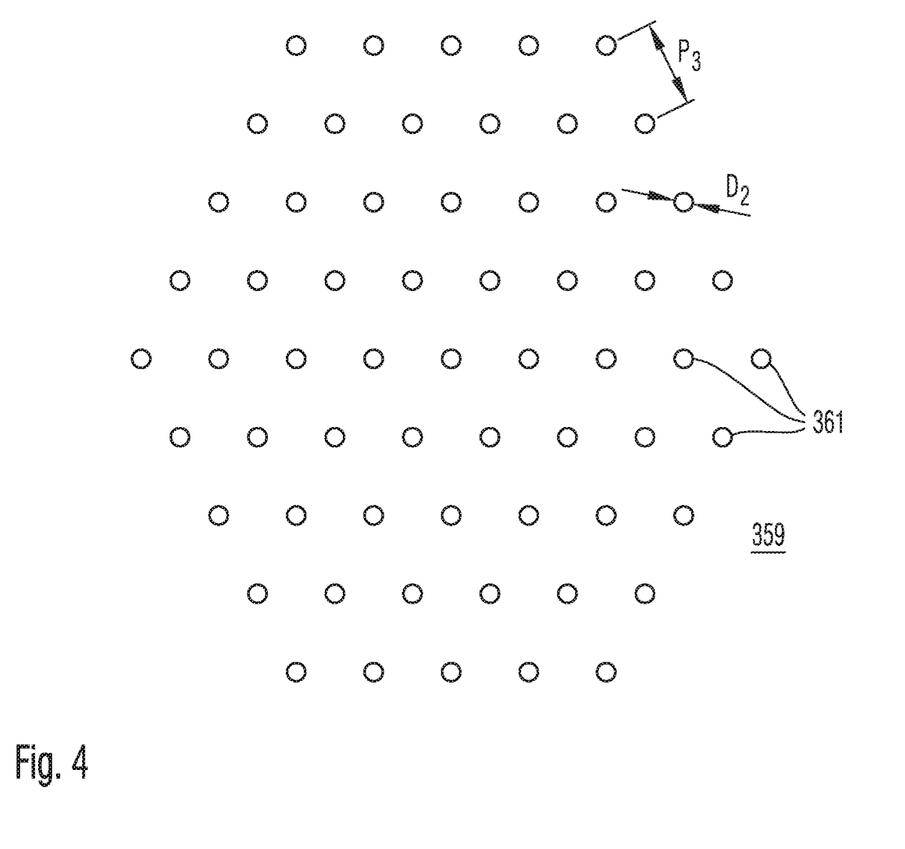
FIG. 4 shows a top view of a second multi-aperture plate of the arrangement in accordance with FIG. 2.

FIG. 4 shows a top view of the second multi-aperture plate 359 with its openings 361. The latter are arranged in the same pattern as the openings 353 in the first multi-aperture plate 351, but have a diameter $D_2$ which is 1.05 to 1.8 times greater than the diameter $D_1$ of the openings 353 in the first multi-aperture plate 351. In the illustrated example, the diameter $D_2$ is 40 micrometres to 80 micrometres, for example approximately 70 micrometres. The first multi-aperture plate 351 and the second multi-aperture plate 359 are positioned relative to one another so that the particle beams formed by the first multi-aperture plate 351 in each case penetrate one of the openings 361 of the second multi-aperture plate 359. Arranged in the beam path downstream of the second multi-aperture plate 359 and at a distance therefrom is the aperture plate 363 with the large opening 365 which is penetrated by all the particle beams 3. A controller 369 applies different electric potentials to the second multi-aperture plate 359 and to the aperture plate 363 so as to form an electric field between the two plates 359 and 363. As a result of this, the openings 361 in the second multi-aperture plate 359 have a focusing effect on the particle beams so that foci 371 of the particle beams 352 result in the plane 367.

The third multi-aperture plate 355 with its openings 357 is arranged between the first multi-aperture plate 351 and the second multi-aperture plate 359 (compare FIG. 2). The openings 357 in the third multi-aperture plate 355 are arranged in the same pattern as the openings 353 and 361 in the two other multi-aperture plates 351 and 359, and the third multi-aperture plate 355 is adjusted relative to the first multi-aperture plate 351 and the second multi-aperture plate 359 so that all the particle beams 352 likewise penetrate the openings 357 in the third multi-aperture plate 355. The openings 361 have an inside diameter $D_3$ which is at least 1.05 times greater than the diameter $D_1$ of the openings 353 in the first multi-aperture plate 351.

Figure 5:
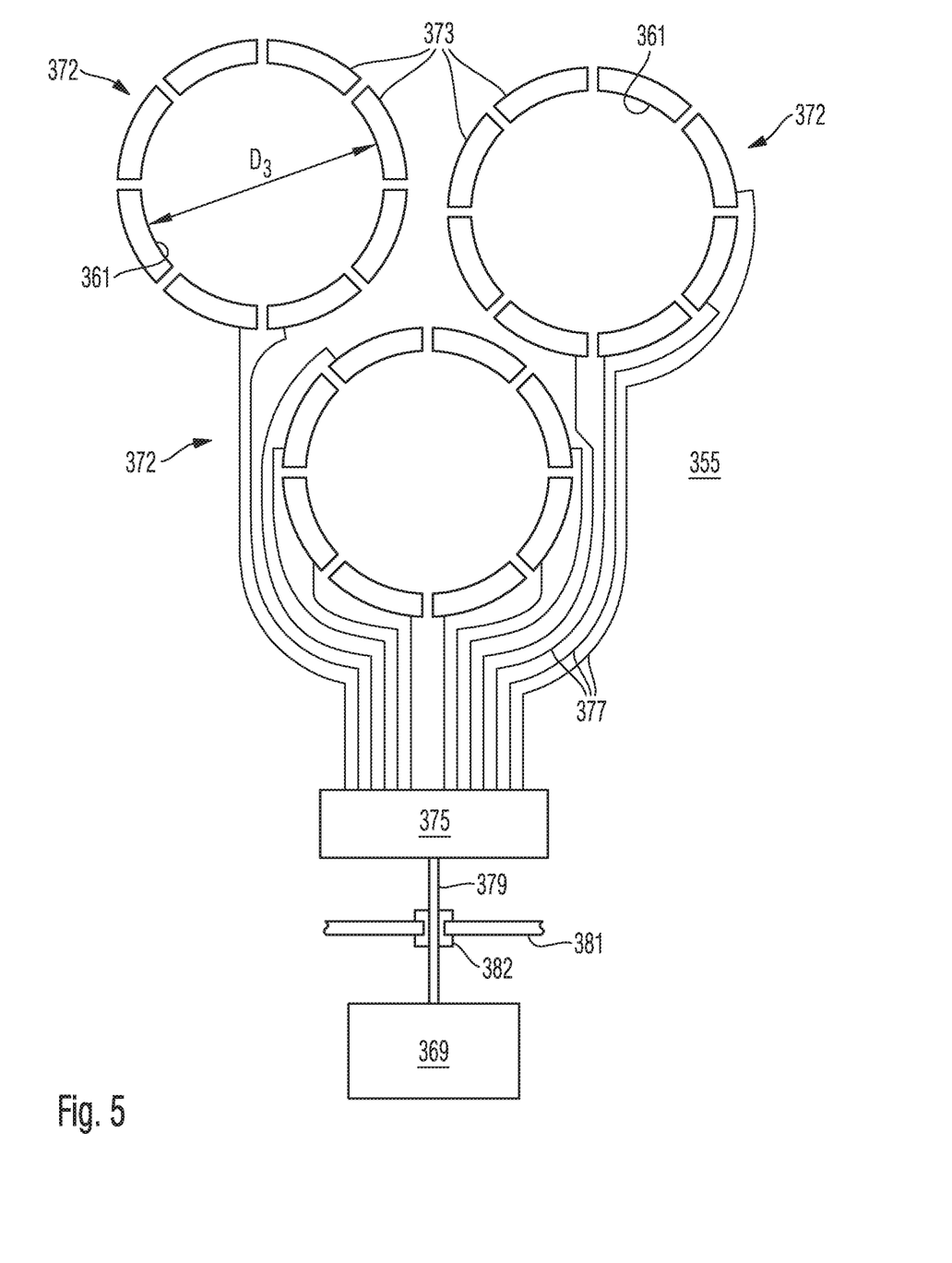
FIG. 5 shows a part of a top view of a third multi-aperture plate of the arrangement in accordance with FIG. 2.

A part of a top view of the third multi-aperture plate 355 is represented diagrammatically in FIG. 5. Each of the openings 361 is assigned a field generator 372 in order to generate a quadrupole field which acts on the beam 3 penetrating the opening 361. Each field generator 372 has eight electrodes 373 which are arranged distributed in a circumferential direction around the opening 361 and are controlled by the controller 369. For this purpose, there is arranged on the multi-aperture plate 355 in a region which is arranged at a distance from the openings 361 an electronic circuit 375 which generates adjustable electric voltages and feeds them to electrodes 373 via lines 377.

The controller 369 controls the electronic circuit 375 via a serial data link 379 which penetrates a vacuum envelope 381 of the particle beam system. Provided in this case is a seal 382 which seals the lines of the serial data link from the vacuum envelope 381. The voltages fed to electrodes 373 via the lines 377 are generated by the electronic circuit 375 as a function of the data received via the serial data link 379 from the controller 369. The controller 369 is therefore capable of generating in each of the openings 361 an electric quadrupole field whose intensity and whose orientation around a centre of the opening 361 can be adjusted. All the particle beams 357 can respectively be individually manipulated with the quadrupole fields. The controller 369 adjusts the quadrupole fields so that they exert an astigmatism on the beams 352 which compensates an astigmatism which is exerted on the beams by the downstream optics such as, for example, the objective lens 102 of FIG. 1, so that the beams are focused in a fashion substantially free of astigmatism (stimagtically) in the object plane 101.

The field generators 372 in the example explained with reference to FIG. 5 are electrodes, and so the fields providing the quadrupole field are electrostatic fields. However, it is also possible to use magnetic fields for this purpose. The field generators are then coils which are mounted in a fashion distributed in a circumferential direction around each opening. It is possible in this case for each coil to have for example only one or only two windings. Such coils can be produced in thin diaphragms made from silicon monocrystal by etching depressions and through holes in the diaphragm and filling the depressions and through holes with a conductive material.

Figure 6:
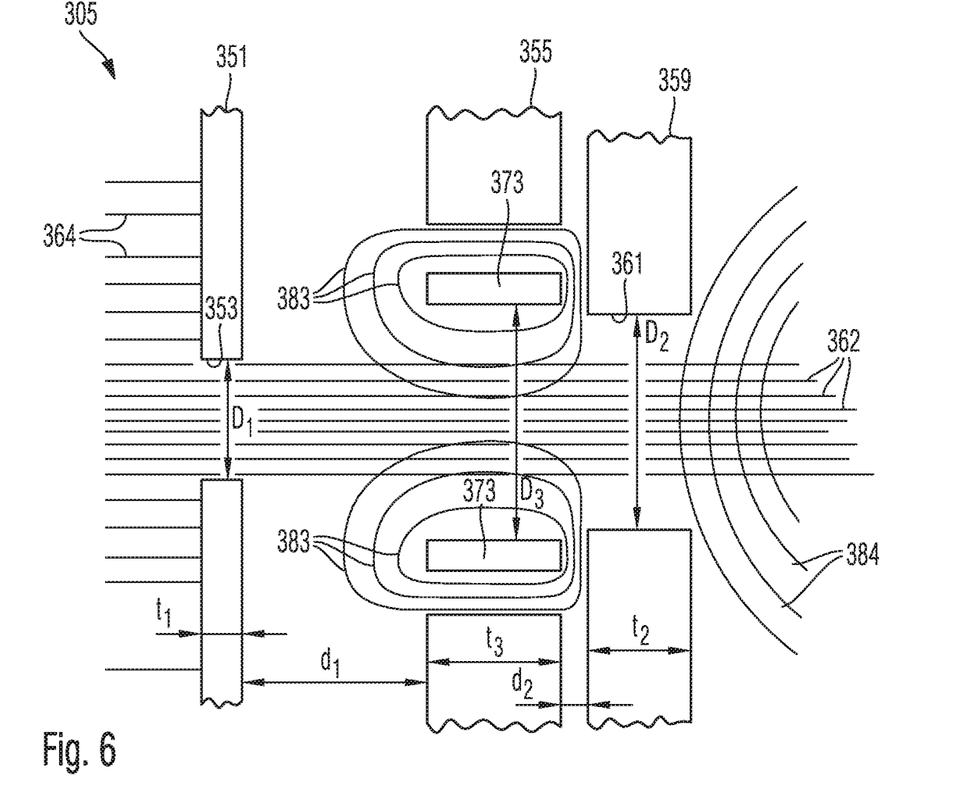
FIG. 6 shows a more detailed representation of a part of the arrangement in accordance with FIG. 2.

FIG. 6 is a sectional view, corresponding to FIG. 2, through the arrangement 305, more details emerging from FIG. 6. What is illustrated are the trajectories 362 of particles which pass through one of the apertures of the first, second and third multi-aperture plates 351, 355, 359, and trajectories 364 of particles which are incident onto the first multi-aperture plate 351 and do not penetrate the latter. Likewise illustrated diagrammatically are the equipotential lines 384 of the electrostatic lens field which is formed by the electrostatic field between the second multi-aperture plate 359 and the aperture plate with only a single large opening (not shown in FIG. 6). Also drawn in diagrammatically are the equipotential lines 383 of the quadrupole fields which are generated via the field generators 373 of the third multi-aperture plate 355.

In the example illustrated, the thickness $t_1$ of the first multi-aperture plate 351 is 5 micrometres to 100 micrometres, for example 10 micrometres. In the example illustrated, the thickness $t_2$ of the second multi-aperture plate 359 is 10 micrometres to 200 micrometres, for example 25 micrometres. In the example illustrated, the thickness t3 of the third multi-aperture plate 355 is 10 micrometres to 200 micrometres, for example 30 micrometres. In the example illustrated, the distance $d_1$ between the first multi-aperture plate 351 and the third multi-aperture plate 355 is 10 micrometres to 500 micrometres, for example 45 micrometres. In the example illustrated, the distance $d_2$ between the third multi-aperture plate 355 and the second multi-aperture plate 359 is 1 micrometre to 100 micrometres, for example 8 micrometres. In the example illustrated, the distance between the second multi-aperture plate 359 and the aperture plate 363 (not illustrated in FIG. 6) (compare FIG. 2) is 1000 micrometres to 40000 micrometres, for example 5000 micrometres.

Figure 7:
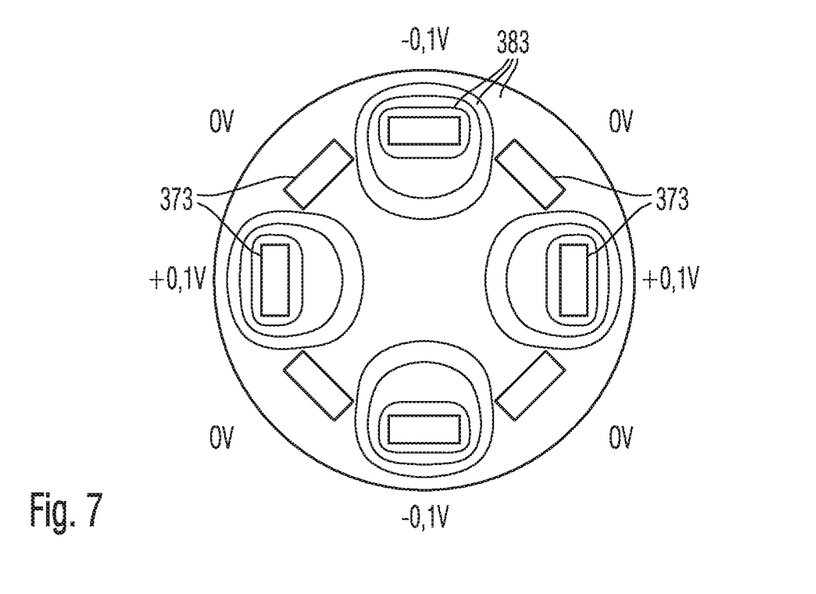
FIG. 7 shows a more detailed representation of a part of the top view in accordance with FIG. 5.

FIG. 7 is a top view of one of the openings 361 in the third multi-aperture plate 355, the field lines of a generated electric quadrupole field being illustrated. The voltages applied to generate the quadrupole field and assigned to the electrodes 373 are specified in FIG. 7.

Figure 8:
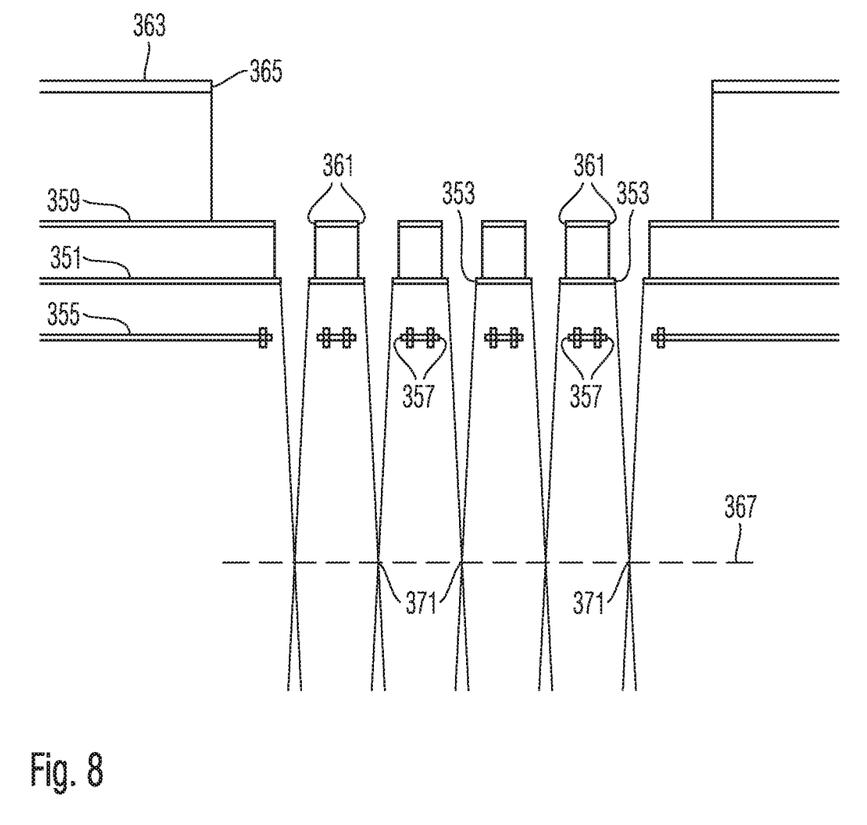
FIG. 8 shows a diagrammatic representation of an arrangement from three multi-aperture plates in accordance with a further embodiment.

FIG. 8 shows an arrangement 305 of a first multi-aperture plate 351 with openings 353, a second multi-aperture plate 359 with openings 361 and a third multi-aperture plate 355 with openings 357, as well as an aperture plate 363 with a single opening 365, which is largely similar to the arrangement shown in FIG. 2, but differs therefrom with regard to the sequence of the arrangement of the plates. In the case of the arrangement 305 shown in FIG. 8, as well, the particles generated by a particle source are incident onto the arrangement 305 from above in the representation of the figure and firstly penetrate the opening 365 in the aperture plate 363. The particle beams 3 formed in the beam path downstream of the arrangement 305 are defined by the openings 353 in the middle first multi-aperture plate 351. However, prior thereto the particle beams penetrate the openings 361 in the second multi-aperture plate 359, which multi-aperture plate provides a lens action which is generated by an electric field which is generated between the aperture plate 363 and the second multi-aperture plate 359 by a controller 369. The openings 357 in the third multi-aperture plate 355 have field generators, in turn, that is to say electrodes in the illustrated exemplary embodiment, in order to generate quadrupole fields in the openings.

Figure 9:
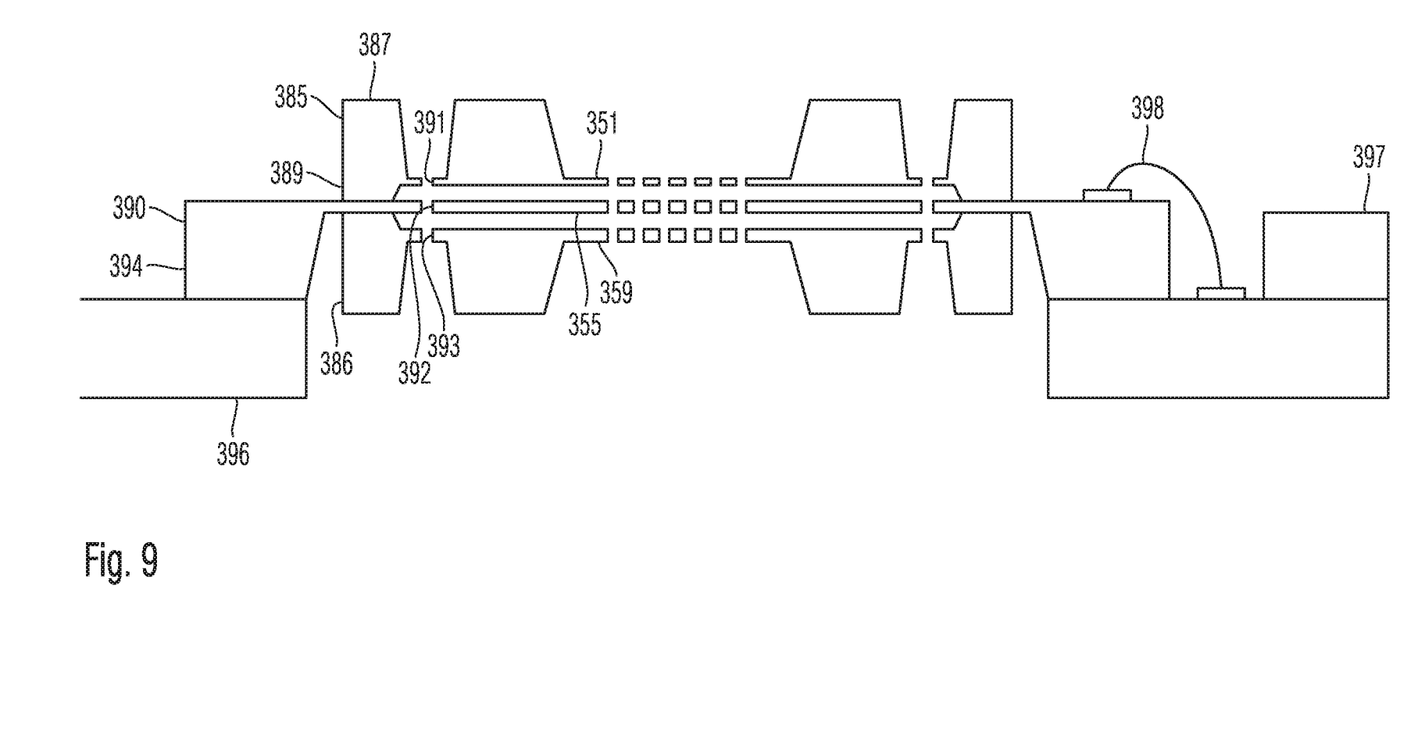
FIG. 9 shows a diagrammatic cross section of an arrangement of a plurality of multi-aperture plates.

FIG. 9 is a cross section, corresponding to FIG. 2, for the arrangement of a plurality of multi-aperture plates, the illustration revealing details of the holding of the aperture plates relative to one another and their production. The illustration of FIG. 9 is diagrammatic. In particular, the direction in the propagation direction of the particle beams (vertical direction in the plane of the drawing) is illustrated using a substantially larger enlargement factor than the direction perpendicular thereto (horizontal direction in the plane of the drawing).

The three multi-aperture plates 351, 355 and 359 among which include the openings for the passage of the particle radiation, are very thin. The plates are produced in each case from a substantially thicker plate made from a silicon monocrystal. The thin regions and the openings are formed therein by anisotropic etching. The regions where the aim is to etch, or not to etch, in individual process steps are defined by conventional lithography steps.

The first multi-aperture plate 351 is a thinner diaphragm region of a thicker first plate 385, the second multi-aperture plate 359 is a thinner diaphragm region of a thicker second plate 386, and the third multi-aperture plate 355 is a thinner diaphragm region of a thicker third plate 390. The first plate 385 for the first multi-aperture plate 351 has a thick frame region 387 with a projection 389 with which the first plate 385 is supported at the diaphragm region of the third plate 390 and fastened. The fastening between the plates 385 and 389 can be done, for example, by bonding. In order to control the relevant bonding process, there are provided in the frame region 387 a plurality of openings 391 which, given correct positioning of the openings of the first multi-aperture plate 351 and of the third multi-aperture plate 355, are flush relative to one another with openings 392 which are provided in the third plate 390. The alignment of the openings 391 and 392 relative to one another can be checked under a microscope during the bonding operation. Manipulators can be used to move the plates relative to one another before curing of the bonding agent used, and to position them correctly. In a similar way, the frame region of the second plate 386 for the second multi-aperture plate 359 is supported at the third plate 390 and likewise has openings which are flush with the openings 393 in the third plate 390, in order also to fasten the second plate 386 at the third plate 390 by bonding. A frame region 394 of the third plate 390 is supported on a base 396 which serves as holder for the arrangement of the multi-aperture plates.

FIG. 9 illustrates, once again diagrammatically, a connection 397 for the data link 379 (compare FIG. 5) and a lead 398 for electric signals onto the third plate 390, the signals being converted into excitations of the field generators of the third multi-aperture plate 355, as has already been described above in conjunction with FIG. 5.

In the exemplary embodiment illustrated in FIG. 9, the multi-aperture plate arranged in the beam path in the middle in the arrangement of the three multi-aperture plates supports the two other multi-aperture plates.

Variants hereof are conceivable, such that, for example, the multi-aperture plate arranged firstly in the beam path supports the two others in that the latter are fastened to the first by bonding. It is also possible for the first multi-aperture plate in the beam path to be connected by bonding to the second multi-aperture plate in the beam path, while the third multi-aperture plate in the beam path is connected by bonding to the second multi-aperture plate in the beam path.

It is, furthermore, possible to hold individual multi-aperture plates separately on the base 396 by holders so that they are not connected to other multi-aperture plates by bonding. In the event of separate holding of two or all three multi-aperture plates on the base, it is also possible to provide actuators in the holders, for example piezoactuators, in order to align the multi-aperture plates relative to one another by operating the actuators. The alignment of the multi-aperture plates relative to one another is then possible, in particular, during operation.

The invention claimed is:

1. A multi-beam apparatus for observing a surface of a sample, comprising:
    an electron source;
    a collimating lens below said electron source;
    a source-conversion unit below said collimating lens;
    a primary projection imaging system below said source-conversion unit;
    a deflection scanning unit below said source-conversion unit;
    a sample stage below said primary projection imaging system;
    a beam separator below said source-conversion unit;
    a secondary projection imaging system above said beam separator; and
    an electron detection device with a plurality of detection elements,
    wherein said electron source, said collimating lens and said source-conversion unit are aligned with a primary optical axis of said apparatus, and said sample stage sustains said sample so that said surface faces to said primary projection imaging system, wherein said source-conversion unit comprises a beamlet-forming means with a plurality of beam-limit openings and an image-forming means with a plurality of electron optics elements each having a micro-multipole-lens, wherein said electron source generates a primary-electron beam along said primary optical axis, and said collimating lens collimates said primary-electron beam into said source-conversion unit, wherein a plurality of beamlets of said primary-electron beam respectively passes through said plurality of beam-limit openings and is focused to form a plurality of parallel images of said electron source by said plurality of electron optics elements respectively, and said plurality of beam-limit openings limits currents of said plurality of beamlets, wherein said primary projection imaging system projects said plurality of parallel images onto said surface and therefore said plurality of beamlets forms a plurality of probe spots thereon, said micro-multipole-lens of said each electron optics element compensates off-axis aberrations of one corresponding probe spot, and said deflection scanning unit deflects said plurality of beamlets to scan said plurality of probe spots respectively over a plurality of scanned regions within an observed area on said surface, wherein a plurality of secondary electron beams is generated by said plurality of probe spots respectively from said plurality of scanned regions and directed into said secondary projection imaging system by said beam separator, said secondary projection imaging system focuses and keeps said plurality of secondary electron beams to be detected by said plurality of detection elements respectively, and each detection element therefore provides an image signal of one corresponding scanned region.

2. The multi-beam apparatus according to claim 1, further comprising a pre-beamlet-forming means for reducing Coulomb effect, which is close to said electron source and has a plurality of beamlet-forming apertures, wherein each of said plurality of beamlets passes through one of said plurality of beamlet-forming apertures and therefore said plurality of beamlet-forming apertures cut off most of those electrons which do not constitute said plurality of beamlets.

3. A method to configure a source-conversion unit in a multi-beam apparatus for observing a surface of a sample, comprising: providing a beamlet-forming means with a plurality of beam-limit openings; providing an image-forming means with a plurality of electron optics elements; providing one or more micro-multipole-lenses in each of said plurality of electron optics elements; and enabling said one or more micro-multipole-lenses to generate a round-lens field, a dipole field and a quadrupole field for compensating field curvature, distortion and astigmatism of one corresponding probe spot of said apparatus.

4. A method to reduce Coulomb effect in a multi-beam apparatus for observing a surface of a sample, comprising: placing a pre-beamlet-forming means between an electron source and a source-conversion unit of said apparatus, wherein said pre-beamlet-forming means has a plurality of beamlet-forming apertures which divide a primary-electron beam of said electron source into a plurality of beamlets, wherein a plurality of beam-limit openings of said source-conversion unit limits currents of said plurality of beamlets, and wherein said source-conversion unit includes one or more micro-multipole-lenses that compensate off-axis aberrations of a corresponding probe spot.

5. A device for providing multiple sources, comprising: a charged-particle source for providing a primary beam along an optical axis of the device; means for forming a plurality of parallel images of the charged-particle source and for generating a plurality of dipole fields and quadrupole fields, wherein the plurality of parallel images becomes multiple sources that emit a plurality of beamlets respectively; and means for selecting currents of the plurality of beamlets with positions of the plurality of parallel images being remained, between the charged-particle source and the imaging means.

6. The device according to claim 5, further comprising means for suppressing Coulomb effect due to the primary beam.

7. A multi-beam apparatus, comprising the device for providing the multiple sources according to claim 5; means for projecting said multiple sources onto a sample surface and forming a plurality of probe spots thereon; means for scanning the plurality of probe spots on the sample surface; and means for receiving a plurality of signal particle beams coming from the plurality of probe spots.

8. A device for providing multiple sources, comprising: a charged-particle source for providing a primary beam along an optical axis of the device; a lens for condensing the primary beam along the optical axis; a plate including a plurality of openings for trimming the primary beam into a plurality of beamlets; and a plurality of micro-multi pole-lens for respectively focusing the plurality of beamlets to form a plurality of images of the charged-particle source, and providing a plurality of dipole fields and quadrupole fields individually, wherein the plurality of images becomes the multiple sources which emit the plurality of beamlets respectively.

9. The device according to claim 8, further comprising means for suppressing Coulomb effect due to the primary beam.

10. A multi-beam apparatus, comprising the device for providing the multiple sources according to claim 9; means for imaging the multiple sources onto a sample surface to form a plurality of probe spots; means for scanning the plurality of probe spots; and means for receiving a plurality of signal particle beams from the plurality of probe spots.

* * * * *

UNITED STATES PATENT AND TRADEMARK OFFICE
CERTIFICATE OF CORRECTION

PATENT NO. : 10,600,613 B2
APPLICATION NO. : 16/196081
DATED : March 24, 2020
INVENTOR(S) : Dirk Zeidler et al.

It is certified that error appears in the above-identified patent and that said Letters Patent is hereby corrected as shown below:

On the Title Page

Page 2, Column 2 (Other Publications), Line 3, delete "nanopattering," and insert
-- nanopatterning, --;

In the Specification

Column 5, Line 18, delete "there" and insert -- their --;

Column 5, Line 62, delete "12" and insert -- I2 --;

Column 8, Line 31, delete "(stimagtically)" and insert -- (stigmatically) --;

Column 8, Line 64, delete "t3" and insert -- $t_3$ --;

In the Claims

Column 12, Lines 39-40, Claim 8, delete "micro-multi pole-lens" and insert
-- micro-multipole-lens --.

Signed and Sealed this
Nineteenth Day of May, 2020

Andrei Iancu
*Director of the United States Patent and Trademark Office*